United States Patent
Doan et al.

(10) Patent No.: US 10,902,177 B1
(45) Date of Patent: Jan. 26, 2021

(54) RECONFIGURABLE SWITCH FOR A COMPUTING SYSTEM

(71) Applicant: Cadence Design Systems, Inc., San Jose, CA (US)

(72) Inventors: Ty Doan, San Jose, CA (US); Pinchas Herman, San Jose, CA (US); Vu Nguyen, San Jose, CA (US); David Abada, San Jose, CA (US); Zhanhe Shi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/280,135

(22) Filed: Feb. 20, 2019

(51) Int. Cl.
| | | |
|---|---|---|
| *G06F 30/30* | (2020.01) | |
| *G06F 30/398* | (2020.01) | |
| *G06F 15/80* | (2006.01) | |
| *G06F 30/34* | (2020.01) | |

(52) U.S. Cl.
CPC ............ *G06F 30/398* (2020.01); *G06F 15/80* (2013.01); *G06F 30/34* (2020.01)

(58) Field of Classification Search
CPC ..... H04L 45/28; H04L 67/1097; H04L 12/42; H04L 43/0817; H04L 45/00; H04L 45/60; H04L 49/101; H04L 49/352; H04L 5/0064; H04B 17/309; H04B 17/318; H04J 14/02; H04J 14/0287; G06F 13/4022; G06F 11/2007; G06F 11/2012; G06F 11/2017; G06F 11/2028; G06F 11/2038; G06F 11/2046; G06F 11/2053; G06F 11/2069; G06F 13/4068; G06F 13/4234; G06F 13/4282; G06F 2201/85; G06F 2213/0026; G06F 3/0607; G06F 3/0635; G06F 3/0685; G06F 13/4221; G06F 9/44505; G06F 9/5072; G05B 2219/37337; G05B 2219/37434
USPC .................................................. 716/118–125
See application file for complete search history.

(56) References Cited

U.S. PATENT DOCUMENTS

| | | | |
|---|---|---|---|
| 5,430,442 A | 7/1995 | Kaiser et al. | |
| 7,028,134 B2 | 4/2006 | Wang et al. | |
| 7,630,300 B2* | 12/2009 | Warren | H04L 12/433 |
| | | | 370/222 |
| 2005/0185654 A1* | 8/2005 | Zadikian | H04J 14/0227 |
| | | | 370/395.21 |

(Continued)

OTHER PUBLICATIONS

MindSpeed Technologies, "72×72/144×144 3.2 Gbps Asynchronous Crosspoint Switch with Amplif-EYE Signal Conditioning", Dec. 2012, pp. 1-65.

(Continued)

*Primary Examiner* — Binh C Tat
(74) *Attorney, Agent, or Firm* — Vista IP Law Group, LLP

(57) ABSTRACT

A reconfigurable switching apparatus may include a plurality of communications transceivers operable to connect to a plurality of programmable integrated circuits. The reconfigurable switching apparatus may further include a plurality of crosspoint switches operably coupled to the plurality of communications transceivers. The reconfigurable switching apparatus may further include a processing circuitry operably coupled to the plurality of crosspoint switches and operable to program the plurality of crosspoint switches to route a plurality of interconnection paths between the plurality of communications transceivers.

15 Claims, 5 Drawing Sheets

(56) References Cited

U.S. PATENT DOCUMENTS

2006/0018329 A1* 1/2006 Nielsen .................. H04L 47/52
370/401

OTHER PUBLICATIONS

Finisar Corporation, "FDR Parallel Active Optical Cable", Quadwire, from FCBx414QB1Cxx Product Specification, Jan. 2018, pp. 1-9.
MindSpeed Technologies, "M21145/65 6.5 Gbps 80×80/160×160 Crosspoint Switch", 2010, pp. 1-2.
MACOM Technology Solutions, "16 Channel, 28 Gbps Crosspoint Switch & Signal Conditioner" Revision V1, Feb. 2018, pp. 1-103.
QSFP Public Specification, "Quad Small Form-factor Pluggable (QSFP) Transceiver Specification", Revision 1.0, Nov. 2006, pp. 1-75.

\* cited by examiner

RECONFIGURABLE SWITCH FOR A COMPUTING SYSTEM

TECHNICAL FIELD

The present disclosure generally relates to a computing platform and more specifically relates to a reconfigurable switch for routing data paths between programmable integrated circuits of the computing platform.

BACKGROUND

A prototyping platform may be used by developers to design, test, and validate system on a chip (SoC) and application-specific integrated circuit (ASIC) designs. The prototyping platform may include a set of programmable integrated circuits, such as field programmable gate arrays (FPGAs) that developers may use to run a SoC or ASIC design. During use, the programmable integrated circuits of the prototyping platform may communicate with each other by sending and receiving data between the programmable integrated circuits.

The description provided in the background section should not be assumed to be prior art merely because it is mentioned in or associated with the background section. The background section may include information that describes one or more aspects of the subject technology.

SUMMARY

The present disclosure relates to a switch for routing interconnection paths between programmable integrated circuits of a prototyping platform. The prototyping platform may include one or more switches that are operably coupled to the programmable integrated circuits. The one or more switches may be programmed to route and reroute interconnection paths between any two or more of the programmable integrated circuits in the prototyping platform According to certain aspects of the present disclosure, a reconfigurable switching apparatus is provided. The reconfigurable switching apparatus includes a plurality of communications transceivers operable to connect to a plurality of programmable integrated circuits. The reconfigurable switching apparatus further include a plurality of crosspoint switches operably coupled to the plurality of communications transceivers. The reconfigurable switching apparatus further comprise a processing circuitry operably coupled to the plurality of crosspoint switches and operable to program the plurality of crosspoint switches to route a plurality of interconnection paths between the plurality of communications transceivers.

According to certain aspects of the present disclosure, a system is provided. The system includes a plurality of reconfigurable switching apparatuses. Each reconfigurable switching apparatus of the plurality of reconfigurable switching apparatuses includes a plurality of communications transceivers operable to connect to a plurality programmable integrated circuits and to every other reconfigurable switching apparatus from the plurality of reconfigurable switching apparatuses. Each reconfigurable switching apparatus of the plurality of reconfigurable switching apparatuses further includes a plurality of crosspoint switches operably coupled to the plurality of communications transceivers. Each reconfigurable switching apparatus of the plurality of reconfigurable switching apparatuses further includes a processing circuitry operably coupled to the plurality of crosspoint switches and operable to program the plurality of crosspoint switches to route a plurality of interconnection paths between the plurality of communications transceivers.

According to certain aspects of the present disclosure, an apparatus is provided. The apparatus includes communications transceiving means operable to connect to a plurality of programmable integrated circuits. The apparatus further comprises crossswitching means operably coupled to the communications transceiving means. The apparatus further comprises means for programming the crossswitching means to route a plurality of interconnection paths between the means for communications transceiving.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
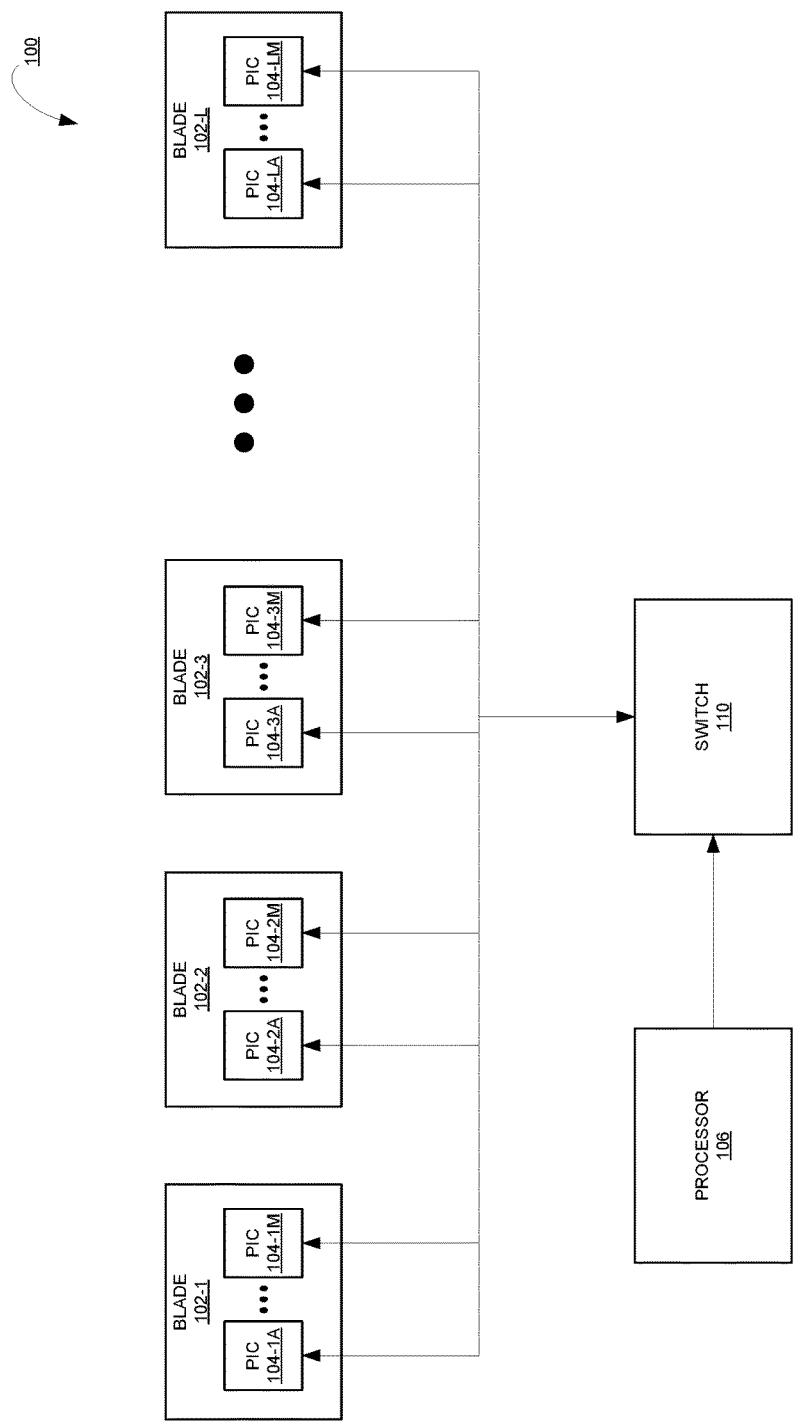
FIG. 1 illustrates an example prototyping system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides for reconfigurable switches in a prototyping platform that may be configured to connect any sets of programmable integrated circuits, such as field programmable gate arrays (FPGAs), in the prototyping platform with each other. A reconfigurable switch in the prototyping system may be able to connect a large number (e.g., 80 or more) of programmable integrated circuits with each other, and two or more switches may be connected with each other to form a switching fabric to further increase the number of programmable integrated circuits that may be connected in the disclosed system. The switches of the prototyping platform may be programmed to configure the interconnection paths between programmable integrated circuits, and may receive updated programming to update or change the interconnection paths between the programmable integrated circuits.

The disclosed system provides an improvement to the functionality of prototyping systems by enabling prototyping system that includes a large number of programmable integrated circuits (e.g., eighty or more programmable integrated circuits) to establish interconnection paths between any of the programmable integrated circuits in the prototyping system by programming one or more reconfigurable switches in the prototyping system, and to update or otherwise change the interconnection paths between programmable integrated circuits in the prototyping system by updating the programming of the one or more reconfigurable switches. By enabling interconnection paths between any of the programmable integrated circuits to be configured and reconfigured via programming the reconfigurable switches, the disclosed system provides a technical advantage over techniques that include physically connecting and disconnecting wires or cables to route interconnection paths between programmable integrated circuits, such as in the case of using a wiring closet to connect programmable integrated circuits.

In addition, multiple reconfigurable switches may be connected together in the disclosed system, so that a prototyping system may be easily expanded by adding additional switches to increase the number of programmable integrated circuits that may be connected in the system, and programming the additional switches to route interconnection paths between programmable integrated circuits of the prototyping system. The disclosed system thereby also provides the technical advantage of enhancing the expandability of programmable integrated circuit-based prototyping systems.

Example System Architecture

FIG. 1 illustrates an example prototyping system 100. As shown in FIG. 1, prototyping system 100 may include blades 102 and switch 110. Blades 102 may be server modules that are arranged in chassis, such as server racks, such that each chassis may house a plurality of blades. For example, blades 102 may be housed in a single chassis or amongst a plurality of chassis in prototyping system 100.

Prototyping system 100 further includes programmable integrated circuits 104 which, for example may be field programmable gate arrays (FPGAs). As shown in FIG. 1, each one of blades 102 may include a plurality of programmable integrated circuits 104. For example, blade 102-1 may include programmable integrated circuits 104-1A through 104-1M, blade 102-2 may include programmable integrated circuits 104-2A through 104-2M, and so on.

Switch 110 is operably connected to each of programmable integrated circuits 104. Switch 110 is operable to route one or more of interconnection paths between any of two or more programmable integrated circuits from programmable integrated circuits 104. For example, switch 110 may be operable to route an interconnection path between programmable integrated circuit 104-1A and programmable integrated circuits 104-2A to enable data to be transmitted between programmable integrated circuit 104-1A and programmable integrated circuit 104-2A. Switch 110 may also be operable to route two or more interconnection paths between a programmable integrated circuit from programmable integrated circuits 104 and two or more other programmable integrated circuits from programmable integrated circuits 104. For example, switch 110 may be operable to route an interconnection path between programmable integrated circuit 104-1A and programmable integrated circuit 104-2A and to route an interconnection path between programmable integrated circuit 104-1A and programmable integrated circuit 104-3A, to enable data to be transmitted between programmable integrated circuit 104-1A and programmable integrated circuit 104-2A and between programmable integrated circuit 104-1A and programmable integrated circuit 104-3A.

Processor 106 may be operably coupled to switch 110 to send instructions for routing interconnection paths to switch 110. Switch 110 may receive the instructions from processor 106 and may configure itself to route interconnection paths according to the instructions. Switch 110 may enable the routing of interconnection paths between any of programmable integrated circuits 104 in system 100, such that switch 110 may route interconnection paths between a programmable integrated circuit of programmable integrated circuits 104 and one or more of the other programmable integrated circuits of programmable integrated circuits 104. Interconnection paths between programmable integrated circuits of programmable integrated circuits 104 may enable programmable integrated circuits connected via such interconnection paths to communicate (e.g., send and receive data) with each other.

Processor 106 may update the interconnection paths between programmable integrated circuits 104 by sending updated instructions that update the routing of interconnection paths between programmable integrated circuits 104. For example, processor 106 may send instructions to switch 110 to route an interconnection path between programmable integrated circuits 104-1A and 104-2A. Subsequently, processor 106 may send instructions to switch 110 to remove the interconnection path between programmable integrated circuits 104-1A and 104-2A and to instead route an interconnection path between programmable integrated circuits 104-1A and 104-3A. In this way, processor 106 may be able to reconfigure switch 110 to add and remove interconnection paths between any of programmable integrated circuits 104.

Example Reconfigurable Switch

Figure 2:
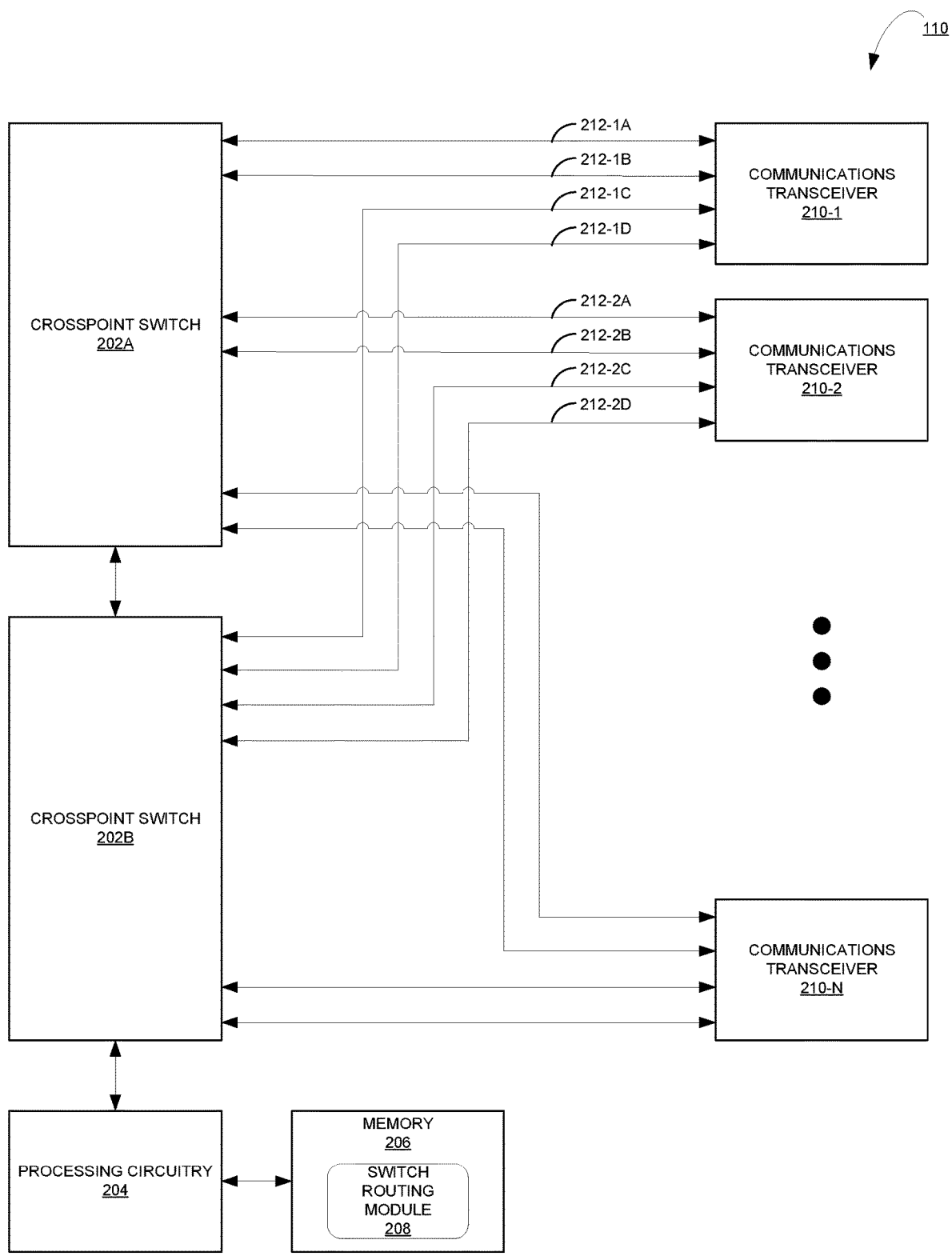
FIG. 2 is a block diagram illustrating an example switch in the system of FIG. 1 according to certain aspects of the disclosure.

FIG. 2 is a block diagram illustrating an example switch in the system 100 of FIG. 1 according to certain aspects of the disclosure. As shown in FIG. 2, switch 110 may include communications transceivers 210, crosspoint switches 202, processing circuitry 204, and memory 206. Memory 206 may include switch routing module 208.

Switch 110 may include a plurality of communications transceivers operable to connect to a plurality of programmable integrated circuits, such as field programmable gate arrays (FPGAs). In the example of FIG. 2, communications transceivers 210 may be operable to connect to programmable integrated circuits 104 shown in FIG. 1, so that switch 110 may route interconnection paths between programmable integrated circuits 104 by routing interconnection paths between communications transceivers 210. Examples of communications transceivers 210 include Quad Small Form-factor Pluggable (QSFP) transceivers, QSFP+ transceivers, and the like. Each communications transceiver from communications transceivers 210 may include a plurality of data channels. In the example where communications transceivers 210 comprises QSFP transceivers or QSFP+ transceivers, each communications transceiver from communications transceivers 210 may include four data channels.

Switch 110 may include a plurality of crosspoint switches operably coupled to the plurality of communications transceivers. In the example of FIG. 2, Crosspoint switches 202 may be operably coupled to communications transceivers 210 and may be operable to route a plurality of interconnection paths between communications transceivers 210.

Switch 110 may include more than one crosspoint switch because a single crosspoint switch may not provide sufficient switching capacity when switching between a great number of communications transceivers 210. For example, if communications transceivers 210 include eighty communications transceivers, then there may be an equal number (80) of communication transceivers 210, each having four channels. Thus, a single crosspoint switch may have to be a 320×320 crosspoint switch to handle the 320 channels from the 80 communication transceivers. Such a 320×320 crosspoint switch may not be as readily available as, for example, 160×160 crosspoint switches. As such, instead of using a single crosspoint switch, switch 110 may include two crosspoint switches: crosspoint switch 202A and crosspoint switch 202B.

Each of the plurality of communications transceivers may be connected to each of the plurality of crosspoint switches. As such, each of communications transceivers 210 in switch 110 may be connected to each of crosspoint switches 202 in switch 110. Thus, each of communications transceivers 210 may be connected to each of crosspoint switch 202A and crosspoint switch 202B.

Each of the communications transceivers 210 may include a plurality of data channels. In the example where communications transceivers 210 include QSFP or QSFP+ transceivers, each of the communications transceivers 210 may include four data channels. In the example of FIG. 2, two channels of a communication transceiver may be connected to crosspoint switch 202A and the remaining two channels of the communication transceiver may be connected to crosspoint switch 202B. For example, data channels 212-1A and 212-1B of communications transceiver 210-1 are connected to crosspoint switch 202A, and data channels 212-1C and 212-1D are connected to crosspoint switch 202B. Similarly, data channels 212-2A and 212-2B of communications transceiver 210-2 are connected to crosspoint switch 202A, and data channels 212-2C and 212-2D are connected to crosspoint switch 202B. Other examples of switches within the scope of the present disclosure may include any suitable number of crosspoint switches, such as three crosspoint switches, four crosspoint switches, and the like.

Switch 110 may include a processing circuitry operably coupled to the plurality of crosspoint switches and operable to program the plurality of crosspoint switches to route a plurality of interconnection paths between the plurality of communications transceivers. In the example of FIG. 2, processing circuitry 204 may execute switch routing module 208 stored in memory 206. Memory 206 may be any suitable storage device for storing instructions to be executed by processing circuitry, including but not limited to Random Access Memory (RAM), a flash memory, a Read Only Memory (ROM), a Programmable Read-Only Memory (PROM), an Electrically Erasable PROM (EEPROM), registers, or any other suitable storage device or computer readable storage medium. Processing circuitry 204 may be a microcontroller, a Digital Signal Processor (DSP), an Application-Specific Integrated Circuit (ASIC), a FPGA, a programmable logic device (PLD), a controller, a state machine, gated logic, discrete hardware components, or any other suitable circuitry or entity for executing instructions stored in memory 206.

Switch routing module 208 may be a set of instructions, such as firmware, that processing circuitry 204 may execute to program crosspoint switches 202 to route a plurality of interconnection paths between communications transceivers 210. Switch routing module 208 may execute to receive an indication of connections between communications transceivers, and may, in response, execute to program crosspoint switches 202 to route a plurality of interconnection paths between communications transceivers based at least in part on the indication of connections between communications transceivers.

The indication of connections between communications transceivers may for each of the connections indicated, indicate a source, a destination, and one or more properties. The source and the destination may indicate the communications transceivers that are to be connected, which the one or more properties may indicate the bandwidth or the granularity of the connection, such as the number of data channels (e.g., from 1 to 4 in the case of QSFP or QSFP+ transceivers) to be connected between the source and the destination. For example, the indications of connections between communications transceivers may include an indication that communications transceivers 210-1 and 210-2 are to be connected via two data channels.

Switch routing module 208 may execute to route a plurality of interconnection paths between communications transceivers 210 by programming crosspoint switches 202. To program crosspoint switches 202, processing circuitry 204 may send instructions to crosspoint switches 202. For example, crosspoint switch 202B may be connected to processing circuitry 204 and crosspoint switch 202A via a serial connection. Thus, processing circuitry 204 may send instructions to crosspoint switch 202B, and, in turn, crosspoint switch 202B may send those instructions to crosspoint switch 202A, so that crosspoint switches 202A and 202B may configure their interconnection paths according to the instructions sent by processing circuitry 204. In this way, switch 110 may route interconnection paths between any of communications transceivers 210.

Switch routing module 208 may execute to route a plurality of interconnection paths between communications transceivers 210 by programming crosspoint switches 202 by programming the data channels 212 and crosspoint switches 202 that are to make up the interconnection paths between communications transceivers 21. For example to route an interconnection path between communications transceivers 210-1 and 210-2, switch routing module 208 may execute to determine the data channels 212 and the crosspoint switches 202 that are to make up the interconnection path.

For example, switch routing module 208 may execute to select either crosspoint switch 202A or crosspoint switch 202B is to take part in the interconnection path. If switch routing module 208 selects crosspoint switch 202A, switch routing module 208 may select either data channel 212-1A or data channel 212-1B to be the portion of the interconnection path that routes data between communications transceiver 210-1 and crosspoint switch 202A. Similarly, if switch routing module 208 selects crosspoint switch 202A, switch routing module 208 may select either data channel 212-2A or data channel 212-2B to be the portion of the interconnection path that routes data between communications transceiver 210-2 and crosspoint switch 202A. In this way, switch routing module 208 may execute route an interconnection path between communications transceivers 210-1 and 210-2.

Figure 3:
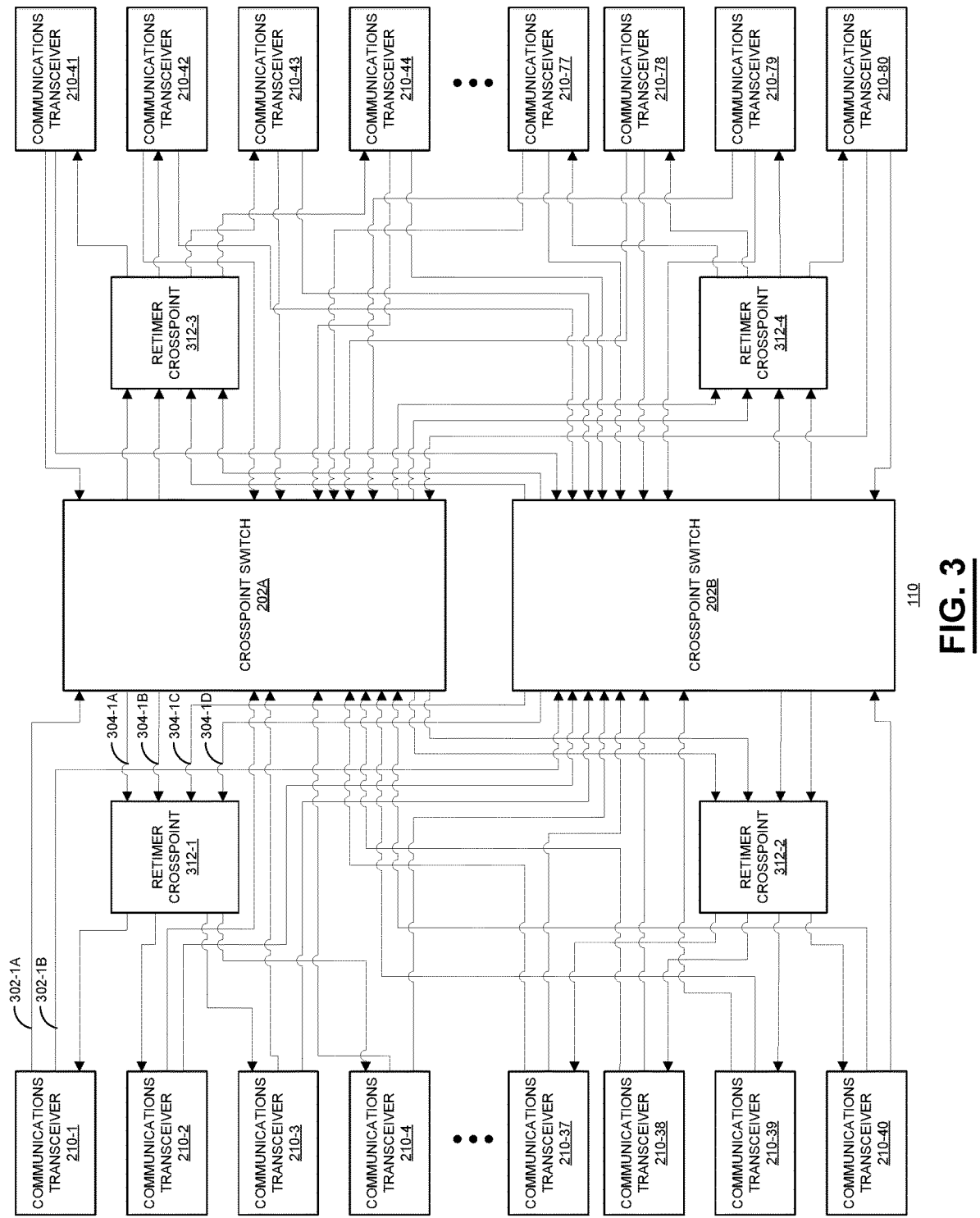
FIG. 3 is a block diagram illustrating the example switch of FIGS. 1 and 2 in further detail.

FIG. 3 is a block diagram illustrating the example switch 110 of FIGS. 1 and 2 in further detail. As shown in FIG. 3, in addition to crosspoint switches 202 and communications transceivers 210, switch 110 may also include retimer crosspoint switches 312 that are operable to compensate for path loss suffered by signals that travel via between communications transceivers.

As discussed above, each communications transceiver may include one or more data channels for sending and receiving data. In particular, each data channel of a communications transceiver may include a transmit (Tx) lane for sending data and a receive (Rx) lane for receiving data. Thus, each of the plurality of communications transceivers include a plurality of Tx lanes and Rx lanes. For example, a QSFP or QSFP+ transceiver having four data channels may include four Tx lanes and four Rx lanes.

Each communications transceiver may connect to each of the crosspoint switches 202 via one or more Tx lanes and one or more Tx lanes. In the example where each communications transceiver includes four Tx lanes and four Rx lanes, and where switch 110 includes two crosspoint switches: 202A and 202B, each communications transceiver may connect to crosspoint switch 202A via two Tx lanes and may also connect to crosspoint switch 202B via two Tx lanes. For example, communications transceiver 210-1 may connect to crosspoint switch 202A via two Tx lanes 302-1A and may connect to crosspoint switch 202B via two Tx lanes 302-1B.

Similarly, each communications transceiver may also connect to crosspoint switch 202A via two Rx lanes and may also connect to crosspoint switch 202B via two Rx lanes to receive data from each of crosspoint switches 202A and 202B. However, data that is to be received by communications transceivers may suffer path loss, which is the degradation of signals as they pass through connection mediums. As such, instead of directly connecting communications transceivers via Rx lanes of communications transceivers 210 to crosspoint switches 202 to receive data from crosspoint switches 202, switch 110 may include a plurality of retimer crosspoint switches operably coupled to the plurality of crosspoint switches, and each of the plurality of retimer crosspoint switches is connected to each of the plurality of crosspoint switches.

In the example of FIG. 3, retimer crosspoint switches 312 are operably connected to crosspoint switches 202 and communications transceivers 210. In particular, Rx lanes of retimer crosspoint switches 312 are connected to crosspoint switches 202 so that retimer crosspoint switches 312 may receive data from crosspoint switches 202. For example, Rx lanes 304-1A and 304-1B of retimer crosspoint switch 312-1 is connected to crosspoint switch 202A to receive data from crosspoint switch 202A, and Rx lanes 304-1C and 304-1D of retimer crosspoint switch 312-1 is connected to crosspoint switch 202B to receive data from crosspoint switch 202B.

Retimer crosspoint switches 312 may perform operations on the data received from crosspoint switches 202 to compensate for signal loss and may send the data to communications transceivers 210 so that communications transceivers 210 may receive the data via Rx lanes of communications transceivers 210. Rx lanes of communications transceivers are connected to retimer crosspoint switches 312 to receive the data from crosspoint switches 202. In particular, one or more receive lanes of each of the plurality of retimer crosspoint switches is connected to each of the plurality of crosspoint switches to receive data from the plurality of crosspoint switches. For example, Rx lanes 306-1A of communications transceiver 210-1 is connected to retimer crosspoint switch 312-1. Because Rx lanes 304-1 of retimer crosspoint switch 312-1 are connected to each of crosspoint switches 202, communications transceiver 210-1 is able to receive data from any of the crosspoint switches 202 by receiving data from retimer crosspoint switch 312-1.

As shown in FIG. 3, each of the retimer crosspoint switches 312 are operably coupled to a non-overlapping portion of communications transceivers 210. For example, retimer crosspoint switch 312-1 is operably coupled to communications transceivers 210-1 to 210-4, retimer crosspoint switch 312-2 is operably coupled to communications transceivers 210-37-210-40, crosspoint switch 312-3 is operably coupled to communications transceivers 210-41 to 210-44, and retimer crosspoint switch 312-4 is operably coupled to communications transceivers 210-77 to 210-80.

While four retimer crosspoint switches 312-1 through 312-4 are illustrated in FIG. 3, switch 110 may include any suitable number of retimer crosspoint switches. In the example of FIG. 3, each retimer crosspoint switch is a 16×16 retimer crosspoint switch that is operably coupled to four communications transceivers. For example, retimer crosspoint switch 312-1 is connected to communications transceivers 210-1, 210-2, 210-3, and 210-4. Thus, if communications transceivers 210 includes eighty communications transceivers, then switch 110 may include twenty 16×16 retimer crosspoint switches 312.

Because each retimer crosspoint switch from retime crosspoint switches 312 is connected to each of crosspoint switches 202, a retimer crosspoint switch may route data from any of crosspoint switches 202 to a communications transceiver to which it is connected, and a communications transceiver may connect to a single retimer crosspoint switch to receive data transmitted from any one of the crosspoint switches 310. For example, because retimer crosspoint switch 312-2 is connected to crosspoint switch 310A and crosspoint switch 310B, communications transceiver 202-1 may connect to retimer crosspoint switch 312-1 to receive data transmitted from either crosspoint switch 210A or crosspoint switch 210B. As such, the processing circuitry 204 illustrated in FIG. 2 is further operably coupled to the retimer crosspoint switches 312 as well as crosspoint switches 202 to route the plurality of interconnection paths between the plurality of communications transceivers 210 via the plurality of retimer crosspoint switches 312 and the plurality of crosspoint switches 202.

Figure 4:
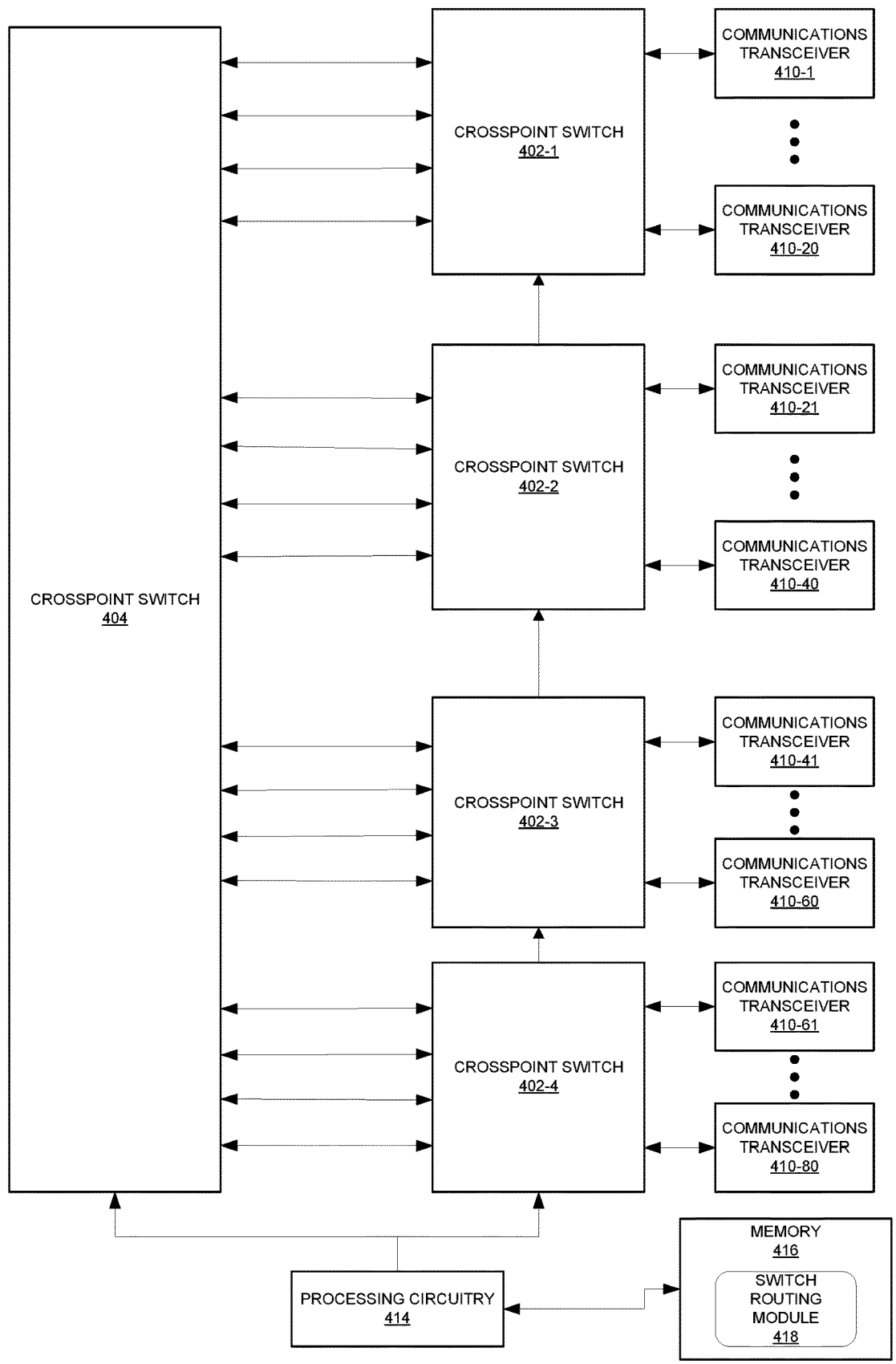
FIG. 4 is a block diagram illustrating an example switch in the system of FIG. 1 according to certain aspects of the disclosure.

FIG. 4 is a block diagram illustrating the example switch 110 of FIG. 1 according to certain aspects of the disclosure. Switch 110 may include crosspoint switches that are arranged in a cascading fashion. For example, a plurality of crosspoint switches may be operably coupled to a plurality of communications transceivers, and a crosspoint switch may be operably coupled to the plurality of crosspoint switches.

As shown in FIG. 4, switch 110 may include crosspoint switches 402 and 404 and communications transceivers 410. Crosspoint switches 402 and 404 are similar to crosspoint switches 202 shown in FIGS. 2 and 3, and communications transceivers 410 may be similar to communications transceivers 210 shown in FIGS. 2 and 3. Crosspoint switches 402 may be operably coupled to communications transceivers 210, and crosspoint switch 404 may be operably coupled to each of crosspoint switches 402.

Unlike what is illustrated in FIGS. 2 and 3, each communications transceiver from communications transceivers 410 in switch 110 is not operably coupled to each of crosspoint switches 402 and 404. Instead, each communications transceiver from communications transceivers 410 is operably coupled to fewer than all of the crosspoint switches 402 and 404. In fact, each of crosspoint switches 402 and 404 is operably coupled to a non-overlapping sub-portion of communications transceivers 410. In the example of FIG. 4, crosspoint switch 402-1 is operably coupled to communications transceivers 410-1 to 410-20, crosspoint switch 402-2 is operably coupled to communications transceivers 410-21 to 410-40, crosspoint switch 402-3 is operably coupled to communications transceivers 410-41 to 410-60, and crosspoint switch 402-4 is operably coupled to communications transceivers 410-61 to 410-80.

In the example where switch 110 includes eighty communications transceivers 410-1 through 410-80, each of crosspoint switches 402 may be made of a set of four 20×12 crosspoint switches to make up an 80×48 crosspoint switch. Thus, each crosspoint switch of crosspoint switches 402 may be connected to twenty of communications transceivers 210 via eighty (20*4) data channels, and may be connected to crosspoint switch 304 via forty-eight (12*4) data channels. Crosspoint switch 402 may be made of a set of six 32*0 crosspoint switches to make up a 192×0 crosspoint switch that may communicate with crosspoint switches via one hundred and ninety two (32*6) data channels.

Switch 110 may include a processing circuitry operably coupled to the plurality of crosspoint switches and operable to program the crosspoint switch and the plurality of crosspoint switches to route a plurality of interconnection paths between the plurality of communications transceivers. In the example of FIG. 4, processing circuitry 414 may execute switch routing module 418 stored in memory 416.

Switch routing module 418 may be a set of instructions, such as firmware, that processing circuitry 414 may execute to program crosspoint switches 402 and 404 to route a plurality of interconnection paths between communications transceivers 410. Switch routing module 418 may execute to receive an indication of connections between communications transceivers, and may, in response, execute to program crosspoint switches 402 and 404 to route a plurality of interconnection paths between communications transceivers based at least in part on the indication of connections between communications transceivers.

The indication of connections between communications transceivers may for each of the connections indicated, indicate a source, a destination, and one or more properties. The source and the destination may indicate the communications transceivers that are to be connected, which the one or more properties may indicate the bandwidth or the granularity of the connection, such as the number of data channels (e.g., from 1 to 4 in the case of QSFP or QSFP+ transceivers) to be connected between the source and the destination. For example, the indications of connections between communications transceivers may include an indication that communications transceivers 410-41 and 410-80 are to be connected via two data channels.

Switch routing module 418 may execute to route a plurality of interconnection paths between communications transceivers 410 by programming crosspoint switches 402 and 404. To program crosspoint switches 402 and 404, processing circuitry 414 may send instructions to crosspoint switches 402 and 404. For example, crosspoint switches 402 and 404 may be operably coupled to processing circuitry 414 via a serial connection. Thus, processing circuitry 414 may send instructions to crosspoint switch 404 and 402-4, and, in turn, crosspoint switch 402-4 may send the instructions to crosspoint switch 402-3 and, in turn, to crosspoint switches 402-2 and 402-1 so that crosspoint switches 402 and 404 may configure their interconnection paths according to the instructions sent by processing circuitry 414. In this way, switch 110 may route interconnection paths between any of communications transceivers 410.

Figure 5:
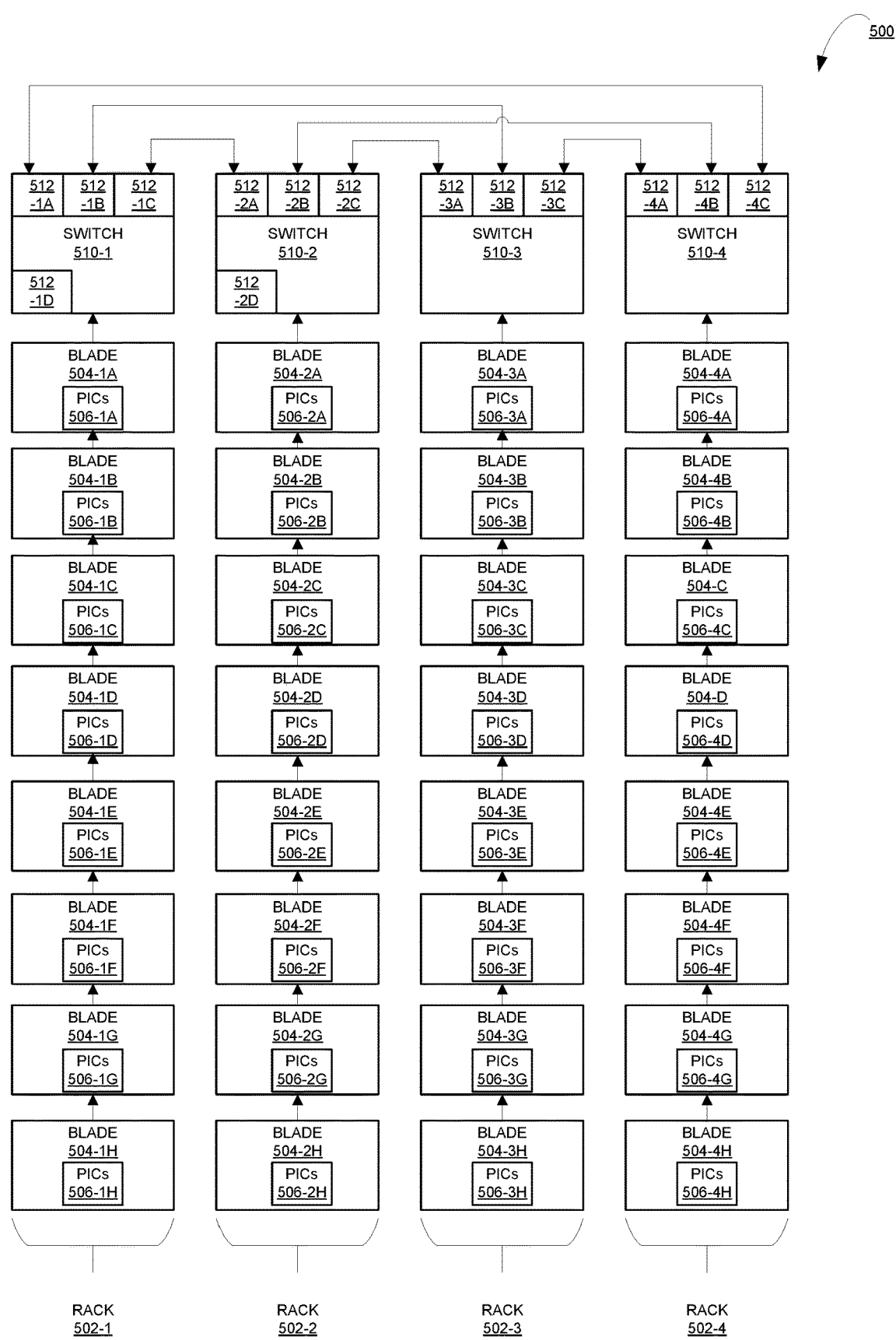
FIG. 5 illustrates an example prototyping system that includes a fabric of switches.

FIG. 5 illustrates an example prototyping system 500 that includes a fabric of switches 510. The prototyping system 500 may include a plurality of reconfigurable switching apparatuses. Each reconfigurable switching apparatus of the plurality of reconfigurable switching apparatuses may include a plurality of communications transceivers operable to connect to a plurality of field programmable logic arrays (FPGAs) and to every other reconfigurable switching apparatus from the plurality of reconfigurable switching apparatuses. Each reconfigurable switching apparatus of the plurality of reconfigurable switching apparatuses may further include a plurality of crosspoint switches operably coupled to the plurality of communications transceivers. Each reconfigurable switching apparatus of the plurality of reconfigurable switching apparatuses may further include a processing circuitry operably coupled to the plurality of crosspoint switches and operable to program the plurality of crosspoint switches to route a plurality of interconnection paths between the plurality of communications transceivers.

As shown in FIG. 5, prototype system 500 may include racks 502 of blades 504 that contain programmable integrated circuits 506. Prototype system 500 may further include switches 510 that may be operable to route interconnections paths between programmable integrated circuits 506 on different blades 504 and racks 502 of prototype system 500.

Blades 504 may be similar to blades 102 shown in FIG. 1. programmable integrated circuits 506 may be similar to Programmable integrated circuits 104 shown in FIG. 1. Switches 510 may each be similar to switch 110 shown in FIGS. 1-4. As such, the description of switch 110 with respect to FIGS. 1-4 are equally applicable to each of switches 510, such that each of switches 510 may include a plurality of communications transceivers, a plurality of crosspoint switches operable coupled to the plurality of communications transceivers, and a processing circuitry operably coupled to the plurality of crosspoint switches and operable to program the plurality of crosspoint switches to route a plurality of interconnection paths between the plurality of communications transceivers.

Each of racks 502 may include a set of blades 504, and each blade from blades 504 may include programmable integrated circuits 506. For example, rack 502-1 may include blades 504-1, and each of blades 504-1 may include programmable integrated circuits 506-1. Rack 502-2 may include blades 504-2, and each of blades 504-2 may include programmable integrated circuits 506-2. Rack 502-3 may include blades 504-3, and each of blades 504-3 may include programmable integrated circuits 506-3. Rack 502-4 may include blades 504-4, and each of blades 504-4 may include programmable integrated circuits 506-4.

Each switch of switches 510 may be associated with a rack of racks 502. For example, switch 510-1 may be associated with rack 502-1, switch 510-2 may be associated with rack 502-2, switch 510-3 may be associated with rack 502-3, and switch 510-4 may be associated with rack 502-4. A switch associated with a rack may be operable to route interconnection paths between programmable integrated circuits that are all in the associated rack as well as to route interconnection paths between programmable integrated circuits in the associated rack with programmable integrated circuits in other racks of racks 502. For example, switch 510-1 associated with rack 502-1 may be operable to route interconnection paths between programmable integrated circuits 506-1 in rack 502-1 and may also be operable to route interconnection paths between programmable integrated circuits 506-1 in rack 502-1 and programmable integrated circuits 506 in other racks 502-2, 502-3, and/or 502-4 of racks 502.

Communications transceivers of switches 510 that are not used to route interconnection paths between programmable integrated circuits 506 in associated racks 502 may be used to connect a switch with each of the other switches of switches 510, so that switches 510 may route interconnection paths between programmable integrated circuits 506 that are operably coupled to two or more different switches from switches 510. In the example of FIG. 5, communications transceivers 512-1 of switch 510-1 are not operably coupled to programmable integrated circuits 506-1 of associated rack 502-1 are used to connect to switches 510-2, 510-3, and 510-4 of switches 510 in prototyping system 500. For example, communications transceivers 512-1A of switch 510-1 may be operably coupled to communications transceivers 512-4C of switch 510-4, communications transceivers 512-1B of switch 510-1 may be operably coupled to communications transceivers 512-3B of switch 510-3, and communications transceivers 512-1C of switch 510-1 may be operably coupled to communications transceivers 512-2A of switch 510-2. Similarly, communications transceivers 512-2B of switch 510-2 may be operably coupled to communications transceivers 512-4B of switch 510-4, and communications transceivers 512-2C of switch 510-2 may be operably coupled to communications transceivers 512-3A of switch 510-3. Communications transceivers 512-3C of switch 510-3 may be operably coupled to communications transceivers 512-4A of switch 510-4. In this way, each switch from switches 510 may include communications transceivers 512 that are operably coupled to each of the other switches form switches 510.

Each switch may include a plurality of communications transceivers that are used to connect to programmable integrated circuits of the associated rack and a plurality of remaining communications transceivers that are not used to connect to programmable integrated circuits of the associated rack. In the example of FIG. 5, each of switches 510 may include eighty communications transceivers, and forty-eight of the eighty communications transceivers are connected to programmable integrated circuits of one of racks 502. Thus, the remaining thirty-two communications transceivers of a switch may be used to connect to other switches of switches 510. In the example where switches 510 include four switches 510-1 to 510-4, each switch of switches 510 may be connected to another switch of switches 510 via ten communications transceivers, such that each switch of switches 510 may connect to the three other switches of switches 510 via a total of thirty (3*10) communications transceivers.

Each of switches 510 may include processing circuitry operably coupled to the crosspoint switches within switches 510 that is operable to program the crosspoint switches to route a plurality of interconnection paths between the plurality of communications transceivers and between switches 510, such that switches 510 may route interconnection paths between any communications transceiver in a switch of switches 510 with any other communications transceivers in any of the other switches of switches 510. In particular, switches 510 may be operable to route interconnection paths between a communications transceiver in a first switch operably coupled to a first programmable integrated circuit to a communications transceiver in a second switch that is operably coupled to a second programmable integrated circuit.

In the example of FIG. 5, communications transceiver 512-1D may be operably coupled to an programmable integrated circuit from programmable integrated circuits 506-1 in rack 502-1, and communications transceiver 512-2D may be operably coupled to an programmable integrated circuit from programmable integrated circuits 506-2 in rack 502-2. To route an interconnection path between communications transceivers 512-1D and 512-2D, switches 510 may be operable to route communications transceiver 512-1D to one or more of communications transceivers 512-1C, from the one or more of communications transceivers 512-1C to one or more of communications transceivers 512-2A in switch 510-1, and from the one or more communications transceivers 512-2A to communication transceiver 512-2D.

In this way, system 500 enables a fabric of switches 510 to be operably connected to each other and to establish interconnection paths between programmable integrated circuits in different racks 502, so that any programmable integrated circuit in any blade or any rack of system 500 may be able to communicate with any other programmable integrated circuit within system 500 that are connected in the fabric of switches 510.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A reconfigurable switching apparatus comprising:
   a plurality of communications transceivers connected to a plurality of programmable gate arrays;
   a plurality of crosspoint switches connected to the plurality of communications transceivers;
   a processing circuit connected to the plurality of crosspoint switches, the processing circuit configuring the plurality of crosspoint switches to connect at least a first gate array of the plurality of programmable gate arrays to at least a second gate array of the plurality of programmable gate arrays; and
   a plurality of retimer crosspoint switches operably coupled to the plurality of crosspoint switches, wherein:
      the processing circuit is further operably coupled to the plurality of retimer crosspoint switches to route a plurality of connection paths between gate arrays using at least the plurality of communications transceivers, the plurality of retimer crosspoint switches, and the plurality of crosspoint switches;
      each of the plurality of communications transceivers include a plurality of transmit lanes and a plurality of receive lanes;
      each of the plurality of transmit lanes are connected to multiple crosspoint switches of the plurality of crosspoint switches; and
      each of the plurality of receive lanes are connected to multiple retimer crosspoint switches of the plurality of retimer crosspoint switches.

2. The reconfigurable switching apparatus of claim 1, where each of the plurality of communications transceivers is operably coupled to each of the plurality of crosspoint switches.

3. The reconfigurable switching apparatus of claim 1, further comprising a crosspoint switch operably coupled to each of the plurality of crosspoint switches, wherein:
   each of the plurality of crosspoint switches is connected to a nonoverlapping portion of the plurality of communications transceivers; and
   the processing circuit is further operably coupled to the crosspoint switch to route a plurality of connection paths between gate arrays using at least the plurality of communications transceivers, the crosspoint switch, and the plurality of crosspoint switches.

4. The reconfigurable switching apparatus of claim 1, wherein each of the plurality of retimer crosspoint switches is connected to each of the plurality of crosspoint switches.

5. The reconfigurable switching apparatus of claim 4, wherein one or more receive lanes of each of the plurality of retimer crosspoint switches is connected to each of the plurality of crosspoint switches to receive data from the plurality of crosspoint switches.

6. The reconfigurable switching apparatus of claim 5, wherein one or more of the plurality of receive lanes of each of the plurality of communications transceivers is operably coupled to a respective retimer crosspoint switch of the plurality of retimer crosspoint switches to receive the data from the respective retimer crosspoint switch.

7. The reconfigurable switching apparatus of claim 1, wherein:
   a first one or more of the plurality of communications transceivers are operable to connect to one or more reconfigurable switching apparatuses external to the reconfigurable switching apparatus; and
   the processing circuit is further operable to program the plurality of crosspoint switches to route one or more interconnection paths between the first one or more of the plurality of communications transceivers operable to connect to the one or more reconfigurable switching apparatuses external to the reconfigurable switching apparatus and a second one or more of the plurality of communications transceivers operable to connect to one or more of the plurality of programmable gate array.

8. A system comprising:
   a plurality of reconfigurable switching apparatuses, wherein each reconfigurable switching apparatus of the plurality of reconfigurable switching apparatuses includes:
      a plurality of communications transceivers connect to a plurality of programmable gate arrays and to every other reconfigurable switching apparatus from the plurality of reconfigurable switching apparatuses;
      a plurality of crosspoint switches connected to the plurality of communications transceivers; and
      a processing circuit connected to the plurality of crosspoint switches, the processing circuit configuring the plurality of crosspoint switches to connect at least a first gate array of the plurality of programmable gate arrays to at least a second gate array of the plurality of programmable gate arrays, wherein:
      each reconfigurable switching apparatus of the plurality of reconfigurable switching apparatuses further includes a plurality of retimer crosspoint switches operably coupled to the plurality of crosspoint switches;
      the processing circuit is further operably coupled to the plurality of retimer crosspoint switches to route a plurality of connection paths between gate arrays using at least the plurality of communications transceivers, the plurality of retimer crosspoint switches, and the plurality of crosspoint switches;
      each of the plurality of communications transceivers include a plurality of transmit lanes and a plurality of receive lanes;
      each of the plurality of transmit lanes are connected to multiple crosspoint switches of the plurality of crosspoint switches; and
      each of the plurality of receive lanes are connected to multiple retimer crosspoint switches of the plurality of retimer crosspoint switches.

9. The system of claim 8, where each of the plurality of communications transceivers is operably coupled to each of the plurality of crosspoint switches.

10. The system of claim 8, wherein:
    each reconfigurable switching apparatus of the plurality of reconfigurable switching apparatuses further includes a crosspoint switch operably coupled to each of the plurality of crosspoint switches;
    each of the plurality of crosspoint switches is connected to a nonoverlapping portion of the plurality of communications transceivers; and
    wherein the processing circuit is further operably coupled to the crosspoint switch to route a plurality of connection paths between gate arrays using at least the plurality of communications transceivers, the crosspoint switch, and the plurality of crosspoint switches.

11. The system of claim 8, wherein each of the plurality of retimer crosspoint switches is connected to each of the plurality of crosspoint switches.

12. The system of claim 11, wherein one or more receive lanes of each of the plurality of retimer crosspoint switches is connected to each of the plurality of crosspoint switches to receive data from the plurality of crosspoint switches.

13. The system of claim 12, wherein one or more of the plurality of receive lanes of each of the plurality of communications transceivers is operably coupled to a respective retimer crosspoint switch of the plurality of retimer crosspoint switches to receive the data from the respective retimer crosspoint switch.

14. The system of claim 8, wherein:
    a first one or more of the plurality of communications transceivers are operable to connect to one or more reconfigurable switching apparatuses external to the reconfigurable switching apparatus; and
    the processing circuit is further operable to program the plurality of crosspoint switches to route one or more interconnection paths between the first one or more of the plurality of communications transceivers operable to connect to the one or more reconfigurable switching apparatuses external to the reconfigurable switching apparatus and a second one or more of the plurality of communications transceivers operable to connect to one or more of the plurality of programmable gate array.

15. The system of claim 8, further comprising a crosspoint switch operably coupled to each of the plurality of crosspoint switches, wherein:
    each of the plurality of crosspoint switches is connected to a nonoverlapping portion of the plurality of communications transceivers; and
    the processing circuit is further operably coupled to the crosspoint switch to route a plurality of connection paths between gate arrays using at least the plurality of communications transceivers, the crosspoint switch, and the plurality of crosspoint switches.

* * * * *